United States Patent
Aiura et al.

(10) Patent No.: US 9,640,383 B2
(45) Date of Patent: May 2, 2017

(54) LIQUID TREATMENT APPARATUS AND LIQUID TREATMENT METHOD

(75) Inventors: Kazuhiro Aiura, Koshi (JP); Norihiro Ito, Koshi (JP); Takashi Nagai, Koshi (JP)

(73) Assignee: Tokyo Electron Limited, Minato-ku (JP)

( * ) Notice: Subject to any disclaimer, the term of this patent is extended or adjusted under 35 U.S.C. 154(b) by 411 days.

(21) Appl. No.: 13/985,679

(22) PCT Filed: Jul. 11, 2012

(86) PCT No.: PCT/JP2012/067685
§ 371 (c)(1),
(2), (4) Date: Aug. 15, 2013

(87) PCT Pub. No.: WO2013/031390
PCT Pub. Date: Mar. 7, 2013

(65) Prior Publication Data
US 2013/0319476 A1 Dec. 5, 2013

(30) Foreign Application Priority Data

Aug. 26, 2011 (JP) .................................. 2011-185245

(51) Int. Cl.
*H01L 21/02* (2006.01)
*H01L 21/67* (2006.01)
*G03F 7/42* (2006.01)

(52) U.S. Cl.
CPC .......... *H01L 21/02057* (2013.01); *G03F 7/42* (2013.01); *H01L 21/6708* (2013.01); *H01L 21/67051* (2013.01); *H01L 21/67115* (2013.01)

(58) Field of Classification Search
CPC ......... H01L 21/02057; H01L 21/67115; H01L 21/67051; H01L 21/67034
See application file for complete search history.

(56) References Cited

U.S. PATENT DOCUMENTS

2004/0231794 A1 11/2004 Hongo et al.
2008/0280453 A1* 11/2008 Koelmel ........... H01L 21/67115
438/758
(Continued)

FOREIGN PATENT DOCUMENTS

JP 07-161674 A1 6/1995
JP 09-199458 A1 7/1997
(Continued)

OTHER PUBLICATIONS

International Search Report dated Oct. 9, 2012.
(Continued)

*Primary Examiner* — Michael Barr
*Assistant Examiner* — Spencer Bell
(74) *Attorney, Agent, or Firm* — Burr & Brown, PLLC

(57) ABSTRACT

A liquid treatment apparatus includes a substrate holding member that holds a substrate horizontally, a rotation mechanism that rotates the substrate holding member; a chemical liquid nozzle that supplies a chemical liquid to the substrate held by the substrate holding member; a top plate that covers the substrate held by the substrate holding member from above the substrate; and at least one LED lamp that heats the substrate during a chemical liquid treatment by irradiating the substrate with light of a predetermined wavelength through the top plate from above the top plate.

10 Claims, 6 Drawing Sheets

(56) References Cited

U.S. PATENT DOCUMENTS

| | | |
|---|---|---|
| 2010/0147335 A1 | 6/2010 | Ito et al. |
| 2010/0326476 A1 | 12/2010 | Rho et al. |
| 2011/0030737 A1 | 2/2011 | Amano et al. |
| 2012/0160274 A1 | 6/2012 | Kasai et al. |

FOREIGN PATENT DOCUMENTS

| | | |
|---|---|---|
| JP | 11-251289 A1 | 9/1999 |
| JP | 2003-151941 A1 | 5/2003 |
| JP | 2003-197591 A1 | 7/2003 |
| JP | 2003-347267 A1 | 12/2003 |
| JP | 2005-142290 A1 | 6/2005 |
| JP | 2006-332198 A1 | 12/2006 |
| JP | 2007-035866 A1 | 2/2007 |
| JP | 2008-004878 A1 | 1/2008 |
| JP | 2009-076705 A1 | 4/2009 |
| TW | 201108314 A1 | 3/2011 |
| TW | 201123280 A1 | 7/2011 |
| WO | 2009/101853 A1 | 8/2009 |

OTHER PUBLICATIONS

Taiwanese Office Action (Application No. 101129511) dated Jun. 26, 2015.
Japanese Office Action (Application No. 2012-155625) dated Sep. 15, 2015.

* cited by examiner

LIQUID TREATMENT APPARATUS AND LIQUID TREATMENT METHOD

BACKGROUND OF THE INVENTION

Field of the Invention

The present invention relates to a liquid treatment apparatus and a liquid treatment method that performs a predetermined chemical liquid treatment to a substrate by supplying a heated treatment liquid to the substrate while rotating the substrate.

Description of Related Art

In semiconductor device manufacturing process, a resist film having a predetermined pattern is formed on a treatment target film formed on a substrate, e.g., a semiconductor wafer (hereinafter referred to simply as "wafer"), a treatment such as etching, ion implantation or the like is performed to the substrate using the resist film as a mask. After the treatment, the resist film which is no longer necessary is removed from the wafer.

Recently, a SPM treatment is often used for removing the resist film. The SPM treatment is performed by supplying the resist film with a SPM (sulfuric acid hydrogen peroxide mixture) of a high temperature obtained by mixing sulfuric acid and hydrogen peroxide solution.

An example of a resist removing apparatus for performing the SPM treatment is disclosed in Japanese patent laid-open publication JP2007-35866A (Patent Document 1). The apparatus of Patent Document 1 includes a spin chuck that holds and rotates a wafer, a splash guard (also called "treatment cup") that surrounds the wafer held by the spin chuck, and a nozzle that supplies a surface of the wafer, on which the resist is formed, with the SPM. The high-temperature SPM supplied onto the surface of the wafer reacts with the resist to produce fume. The fume is gas or mist originated from the SPM and the resist. The fume widely spreads within a chamber of the resist removing apparatus, which may cause generation of contaminant for the wafer. In order to avoid such spreading of the fume, the apparatus of Patent Document 1 is provided with a circular shield plate (also called "top plate") that covers the upper end opening of the splash guard and the wafer held by the spin chuck from above.

The SPM treatment processes a wafer with a high-temperature SPM. The wafer draws the heat from the SPM, so that the temperature of the SPM is likely to lower at locations remote from the discharging point of the SPM. In addition, the peripheral portion of the wafer tends to be cooled due to rotation of wafer. Thus, uneven temperature distribution within a surface of the wafer is likely to occur, and thus the treatment result is likely to be non-uniform. The nozzle of Patent Document 1 supplies SPM to the center of the wafer. Thus, it may be considered that the SPM temperature at the peripheral portion of the wafer is likely to lower. However, Patent Document 1 does not recite any countermeasure against this problem.

Japanese patent laid-open publication JP2008-4878A (Patent Document 2) discloses a resist removing apparatus, which includes a plate (vacuum spin chuck) that holds a back surface (no resist is formed thereon) of the wafer by suction and rotates, a SPM nozzle that supplies SPM to a front surface (having resist and directed upward) of the wafer held by the plate, and a mixed fluid nozzle that supplies a mixed fluid of SPM and nitrogen gas to the front surface of the wafer held by the plate. A heater, which is capable of heating the whole area of the wafer, is embedded within the plate. The wafer is heated by the heater from the back surface of the wafer such that the temperature of the front surface of the wafer becomes within a range from about 200 to 250° C. In this state, the mixed fluid of SPM and nitrogen gas is sprayed to the substrate from the mixed fluid nozzle with the nozzle is moving (scanning), so that the resist is removed. Disposing a heater in the rotation plate as in Patent Document 2 will result in a complicated structure of the rotation plate. In addition, the heater may possibly be exposed to the chemical liquid since the chemical liquid contacts with the plate.

SUMMARY OF THE INVENTION

The present invention provides a liquid treatment technique that can control the substrate temperature efficiently, while preventing spreading of a chemical liquid atmosphere during a chemical liquid treatment, using a simple structure without being exposed to the chemical liquid.

According to the first aspect of the present invention, there is provided a liquid treatment apparatus, which includes: a substrate holding member that holds a substrate horizontally; a rotation mechanism that rotates the substrate holding member; a chemical liquid nozzle that supplies a chemical liquid to the substrate held by the substrate holding member; a top plate that covers the substrate held by the substrate holding member from above the substrate; and at least one LED lamp that heats the substrate during a chemical liquid treatment by irradiating the substrate with light of a predetermined wavelength transmitted through the top plate from above the top plate.

According to the second aspect of the present invention, there is provided a liquid treatment method, which includes: covering a substrate from above the substrate; holding the substrate horizontally and rotating the substrate about a vertical axis; supplying a heated chemical liquid to the rotating substrate; and during a chemical liquid treatment, irradiating the substrate with light of a predetermined wavelength transmitted through the top plate from above the top plate using at least an LED lamp, thereby heating the substrate.

According to the present invention, since the top plate covers the substrate from above, spreading of gas or mist originated from the chemical liquid or processed substances can be avoided. In addition, the LED lamp is disposed above the top plate, and the substrate is irradiated with the LED lamp light of a wavelength suitable for heating the substrate which is transmitted through the top plate. Thus, the surface of the substrate can be heated directly, using a simple structure, without the LED lamp being exposed to the chemical liquid and gas or mist originated from the chemical liquid or processed substances.

DETAILED DESCRIPTION OF THE INVENTION

An embodiment of the present invention will be described herebelow with reference to the drawings.

Figure 1:
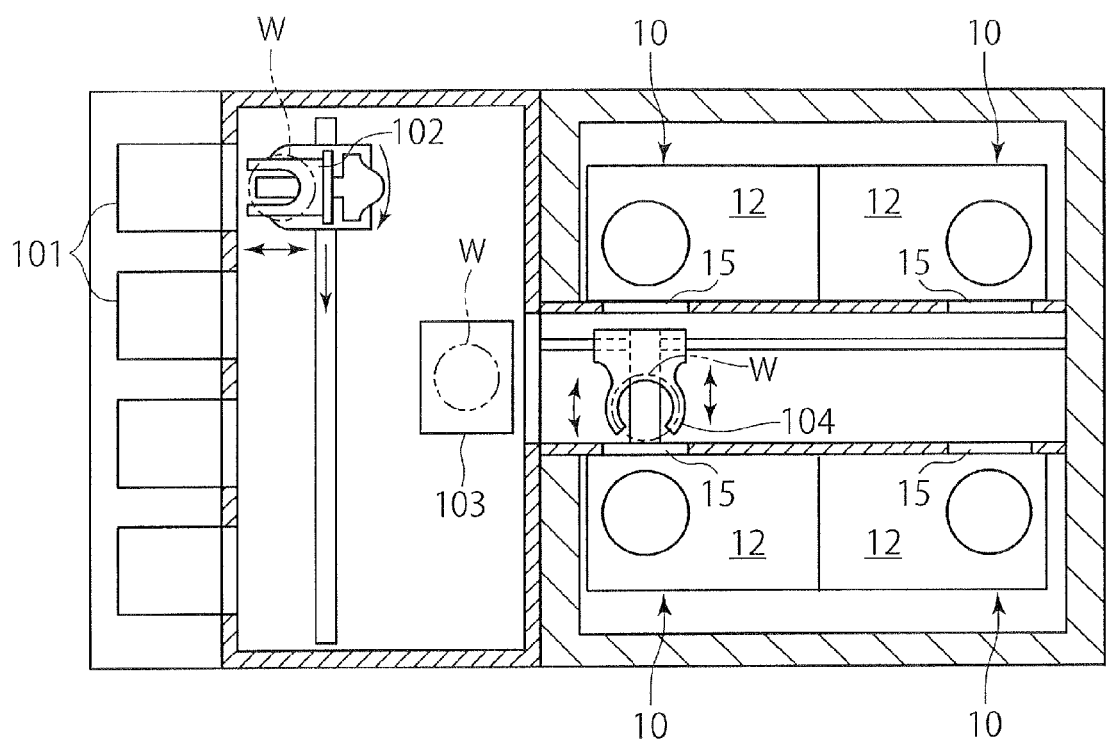
FIG. 1 is top plan view of the liquid treatment system including a substrate cleaning apparatus as a liquid treatment apparatus.

A liquid treatment system including a substrate cleaning apparatus in one embodiment of a liquid treatment apparatus of the present invention is firstly described with reference to FIG. 1. As shown in FIG. 1, the liquid treatment system includes: a stage 101 for placing, thereon from outside, a carrier containing semiconductor wafers W (hereinafter referred to simply as "wafer(s)"); a transfer arm 102 that takes out the wafers W contained in the carrier; a transition unit 103 for placing therein the wafers W taken out by the transfer arm 102; and a transfer arm 104 that receives the wafer W placed on the transition unit 103 and transfers the wafer W into a liquid treatment apparatus 10. As shown in FIG. 1, the liquid treatment system includes a plurality of (four, in the embodiment of FIG. 1) the substrate cleaning apparatuses 10.

Next, the structure of the substrate cleaning apparatus 10 is described with reference to FIGS. 2 and 3. The substrate cleaning apparatus 10 is provided, in a treatment chamber 12 defined by a housing 11 (see FIG. 3) with: a holding plate 20 that holds a wafer W; a lift pin plate 30 arranged coaxially with the holding plate 20; a treatment cup 40 that surrounds the circumference of the wafer W held by the holding plate 20; a top plate 50 that covers the wafer W held by the holding plate 20 from above the wafer W; and a LED lamp unit 60 provided above the top plate 50.

Figure 2:
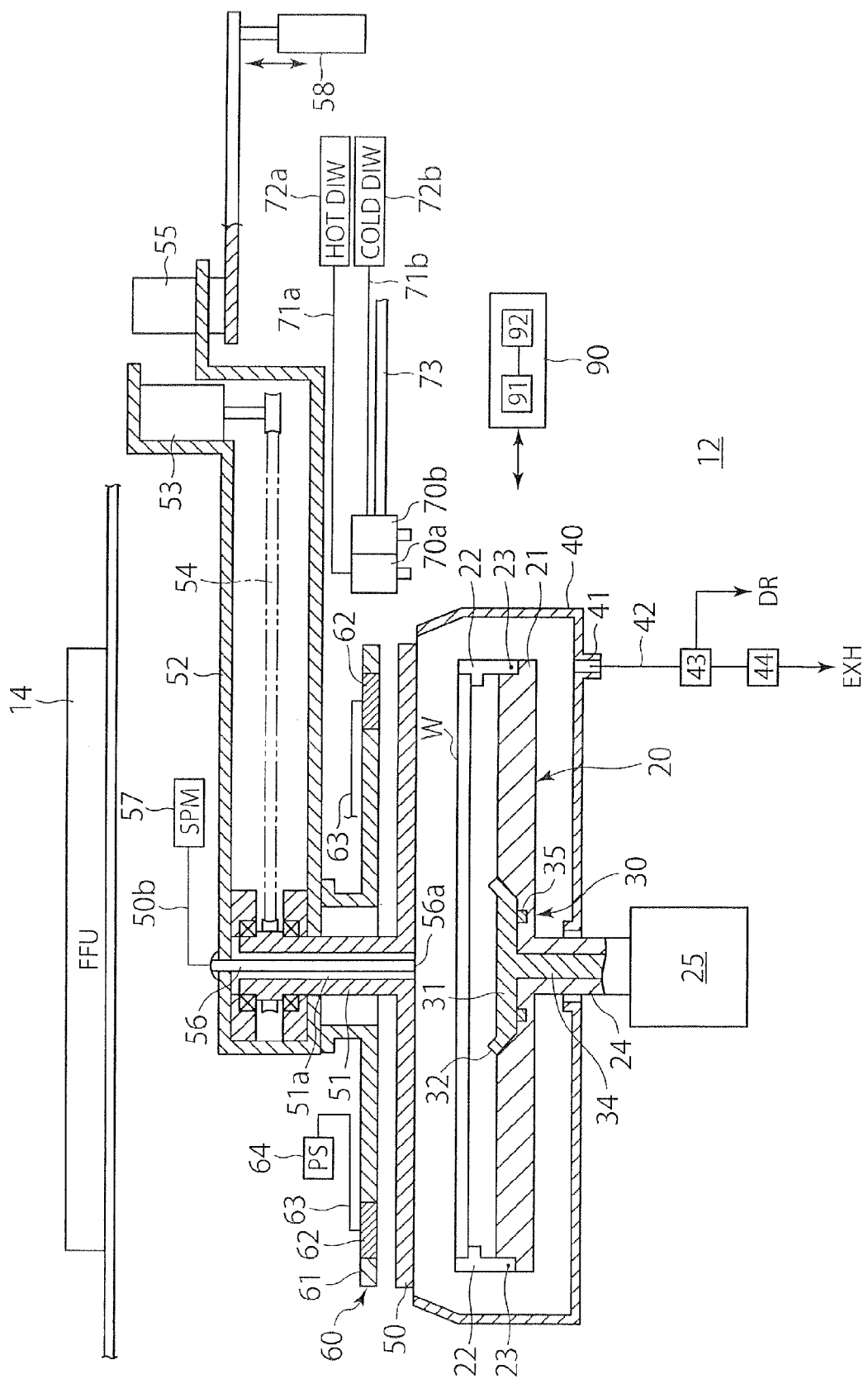
FIG. 2 is a vertical cross sectional view showing the structure of the substrate cleaning apparatus.

As shown in FIG. 2, a fan filter unit (FFU) 14, which generates a downflow of clean air in the treatment chamber 12, is provided on a ceiling of the treatment chamber 12. As shown in FIG. 3, a loading/unloading port 16 for a wafer W provided with a shutter member 15 (not shown in FIG. 1) is formed in a sidewall of the treatment chamber 12. The transfer arm 104 holding a wafer W can enter the treatment chamber 12 through the loading/unloading port 16.

As shown in FIG. 2, the holding plate 20 (also called "spin chuck") includes a circular holding plate body 21 and a plurality of (e.g., three) holding members 22 arranged on the peripheral portion of the holding plate body 21 at equal angular intervals. Each holding member 22 can swing about a shaft 23 so that the holding member 22 can take a holding position shown in the drawing where the holding member 22 holds the peripheral edge of the wafer W, and a releasing position where the holding member 22 is apart from the peripheral edge of the wafer W. A rotation shaft 24 extends downward from the center of a lower surface of the holding plate body 21. The rotation shaft 24 is driven for rotation by a rotation motor (not shown) in a rotation/elevation mechanism 25 which is schematically shown in FIG. 2. Thus, the wafer W can be rotated about a vertical axis passing through the center of the wafer W held horizontally by the holding plate 20 and the holding members 22.

The lift pin plate 30 includes a circular lift pin plate body 31 and a plurality of (e.g., three) lift pins 32 arranged on the peripheral portion of the lift pin plate body 31 at equal angular intervals. The lift pin plate body 31 at its lowered position nests within a recess formed in a central portion of an upper surface of the holding plate body 21. An elevation shaft 34 extends downward from the center of a lower surface of the lift pin plate body 31 through a hollow inside of the rotation shaft 24. The elevation shaft 34 is moved up and down by a vertical driving mechanism, such as an air cylinder (not shown), provided in the rotation/elevation mechanism 25 which is schematically shown in FIG. 2. Thus, only the lift pin plate 30 can move up and down, without moving the holding plate 20 up and down. When the lift pin plate body 31 nests within the recess in the upper surface of the holding plate body 21, the lift pin plate body 31 is engaged with the holding plate body 21 by a suitable engagement means 35 so as to be non-rotatable relative to the holding plate body 21. Thus, when the holding plate 20 is rotated, the lift pin plate 30 is rotated together with the holding plate 20. The engagement means 35 may be composed of projections formed on one of the holding plate 20 and the lift pin plate 30 and dents formed in the other, for example.

As described above, the treatment cup 40 is provided to surround the circumference of the wafer W held by the holding plate 20, so as to receive a treatment liquid scattering outward from the wafer W due to a centrifugal force. As schematically shown in FIG. 2, a discharge port 41 is provided in a bottom part of the treatment cup 40. A discharge line 42 is connected to the discharge port 41. The discharge line 42 is equipped with a mist separator 43 and a suitable exhaust apparatus 44 comprising an ejector or a pump. The liquid separated by the mist separator 43 is disposed into a factory drainage system (DR), while the gas is disposed into to a factory exhaust system (EXH).

Figure 3:
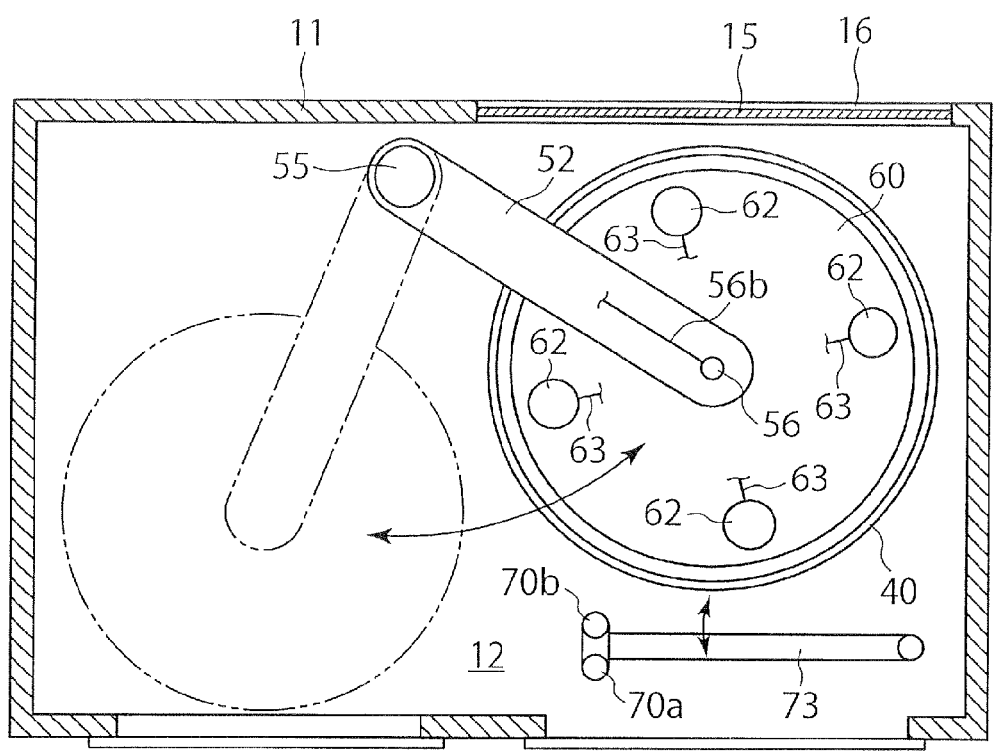
FIG. 3 is a transverse cross sectional view showing the structure of the substrate cleaning apparatus.

The top plate 50, at its treatment position shown by the solid lines in FIGS. 2 and 3, is located in the vicinity of the wafer W held by the holding plate 20 such that top plate 50 covers the wafer W from above the wafer W and substantially closes an upper opening of the treatment cup 40. The diameter of the top plate 50 is preferably a little larger than the diameter of the wafer W. A hollow rotation shaft 51 extends upward from the center of an upper surface of the top plate 50. The rotation shaft 51 is mounted on a distal end portion of a movable arm 52 via a bearing, such that the rotation shaft 51 can be rotated about a vertical axis. A rotation motor 53 is provided on a proximal end portion of the movable arm 52. When the rotation motor 53 is driven for rotation, the rotation is transmitted to the rotation shaft 51 by a suitable transmission means 54 (in the illustrated example, pulleys respectively mounted on an output shaft of the rotation motor 53 and the rotation shaft 51 and a belt wound around the pulleys), whereby the top plate 50 can be rotated. The movable arm 52 can be turned about a vertical axis by driving the rotation motor 55. Along with the turning movement of the movable arm 52, the top plate 50 can be located at a treatment position located right above the wafer W, and at a withdrawal position (position shown by the two-dot chain lines in FIG. 3) withdrawn from the position right above the wafer W. An apparatus for cleaning the top plate 50 is preferably provided at withdrawal position.

A hollow 51a formed in the rotation shaft 51 extends down to the lower surface of the top plate 50 and opens in the lower surface of the top plate 50. A chemical liquid supply pipe 56 is disposed in the hollow 51a. The chemical liquid supply pipe 56 is separated from the rotation shaft 51, so that the chemical liquid supply pipe 56 is not rotated even when the rotation shaft 51 rotates. A chemical liquid is supplied toward the wafer W held by the holding plate 20 from a lower end opening 56a of the chemical liquid supply pipe 56 serving as a chemical liquid nozzle. Namely, the chemical liquid supply pipe 56 functions as a chemical liquid supply nozzle for supplying a chemical liquid onto a treatment target surface of the wafer W. A chemical liquid supply tube 56b is connected to an upper end of the chemical liquid supply pipe 56. The chemical liquid supply tube 56*b* (detailed illustration of the tube 56*b* is omitted) extends outside the movable arm 52 along the movable arm 52, and is connected to a SPM supply mechanism (chemical liquid supply mechanism) 57 which is schematically shown. Due to the provision of the chemical liquid supply tube 56*b* outside the movable arm 52, even if the tube has a trouble, the driving system of the top plate 50 cannot be affected by a chemical liquid. The SPM supply mechanism 57 may be composed of: a heated sulfuric acid supply source; a hydrogen peroxide solution supply source; a mixing apparatus, such as a mixing valve, for mixing sulfuric acid and hydrogen peroxide solution at a predetermined ratio; a flow control valve; an on-off valve (which are not shown); and so on.

As shown in FIGS. 2 and 3, the LED lamp unit 60 includes a circular lamp support 61 supported by the movable arm 52, and one or more (four, in this embodiment) LED lamp(s) 62 supported by the lamp support 61. Each LED lamp 62 can be composed of one light emitting element or a plurality of light emitting element arrays. Since the LED lamp support 61 is fixed on the movable arm 52, the LED lamp unit 60 is not rotated even when the top plate 50 is rotated. On the other hand, along with the swing motion of the movable arm 52, the LED lamp unit 60 is moved together with the top plate 50. Thus, similarly to the top plate 50, the LED lamp unit 60 can take a treatment position right above the wafer W, and a withdrawn position withdrawn from the position right above the wafer W. The shape of the lamp support 61 is arbitrary. For example, the lamp support 61 may be a plurality of plate-like members extending outward from the movable arm 52.

As the LED lamp 62, there is used a lamp that irradiates light of a wavelength suitable for heating the wafer W, specifically, light of a wavelength of 880 nm, for example. Thus, the top plate 50 may be formed of a material, which is highly transmissive to light of a wavelength of 880 nm and SPM corrosion resistant, such as quartz or tetrafluoroethylene (PTFE). The LED lamp 62 is fed by a power supply device (PS) 64 through a feeder line 63 (detailed illustration thereof is omitted) extending along the movable arm 52. In order to cool and protect the LED lamp 62, the lamp support 61 may have a coolant channel for cooling the LED lamp, or the LED lamp 62 may have radiator fins.

In the illustrated embodiment, in order to heat the peripheral portion of the wafer W where a chemical liquid temperature or a wafer temperature tends to lower, the LED lamps 62 are located at positions opposed to the peripheral portion of the wafer W held by the holding plate 20. Since the wafer W is rotating during the treatment, only one LED lamp 62 may be provided on a circumference of a circle. However, it is preferable that the plurality of LED lamps 62 are provided at positions in equal divisions on the circumference.

The substrate cleaning apparatus 10 further includes a rinse nozzle 70*a* that supplies a high temperature DIW (heated deionized water) as a rinse liquid onto the wafer W held by the holding plate 20, and a rinse nozzle 70*b* that supplies a normal temperature DIW (DIW of normal temperature) as a rinse liquid onto the wafer W held by the holding plate 20. The rinse nozzles 70*a* and 70*b* are held by a swing arm 73 that can swing about a vertical axis (see the arrow in FIG. 3). Thus, each of the rinse nozzles 70*a* and 70*b* can be moved between a treatment position (not shown) right above the center of the wafer W, and a withdrawal position (position shown in FIG. 3) withdrawn from the position above the wafer W. High temperature DIW and normal temperature DIW can be respectively supplied to the rinse nozzles 70*a* and 70*b* from a high-temperature DIW supply mechanism 72*a* and a normal-temperature DIW supply mechanism 72*b* through tubes 71*a* and 71*b* disposed along the swing arm 73. Each of the high-temperature DIW supply mechanism and the normal-temperature DIW supply mechanism can be composed of a DIW supply source, a flowrate regulating valve, an on-off valve (which are not shown) and so on.

As schematically shown in FIG. 2, the substrate cleaning apparatus 10 is provided with a controller 90 that performs integrated control of the whole apparatus operation. The controller 90 is configured to control operations of all the functional components of the substrate cleaning apparatus 10 (e.g., the rotation/elevation mechanism 25, the rotation motor 53 of the top plate 50, the rotation motor 55 for swinging the movable arm 52, the valves of the SPM supply mechanism 57, the power supply device 64 for the LED lamps 62 and so on). The controller 90 can be implemented by a multipurpose computer as a hardware and a program (apparatus control program and treatment recipes) as a software for operating the computer. The software is stored in a storage medium, such as a hard disc drive, which fixedly installed in a computer, or stored in a storage medium, such as a CD-ROM, a DVD or a flash memory, which is detachably set in the computer. Such a storage medium is shown by the reference sign 91. A processor 92 calls a predetermined treatment recipe in response to an instruction from a user interface, not shown, according to need, and executes the treatment recipe. Thus, under the control of the controller 90, the respective functional components of the substrate cleaning apparatus 10 are operated to perform a predetermined treatment. The controller 90 may be a system controller that controls the whole liquid treatment system shown in FIG. 1.

Next, a series of steps of a cleaning treatment for removing an unnecessary resist film on a surface of a wafer W, with the use of the aforementioned substrate cleaning apparatus 10, is described.

<Wafer Loading and Installing Step>

The top plate 50 and the LED lamp unit 60 are located at the withdrawal position (position shown by the two-dot chain lines in FIG. 3). From this state, the lift pin plate 30 is elevated so as to be located at an elevated position. Then, the transfer arm 104 (see FIG. 1) holding a wafer W enters the substrate cleaning apparatus 10 through the loading/unloading port 16, places the wafer W on the lift pin 32 of the lift pin plate 30, and exits from the substrate cleaning apparatus 10. Thereafter, the lift pin plate 30 is lowered to lower the wafer W down to a height at which the holding member 22 of the holding plate 20 can hold the wafer W. After the holding member 22 has held the wafer W, the lift pin plate 30 is further lowered so as to nest within the holding plate 20 (state shown in FIG. 2). The wafer W is held by the holding plate 20 such that the "front surface" (the surface having a resist pattern) of the wafer W is an "upper surface" and the "back surface" (no resist pattern is formed thereon) is a "lower surface".

<SPM Cleaning Step>

Then, the movable arm 52 is swung so that the top plate 50 and the LED lamp unit 60 are located at the treatment position directly above the wafer W (position shown in FIG. 2, position shown by the solid lines in FIG. 3). In this state, the holding plate is rotated by the rotation motor (not shown) of the rotation/elevation mechanism 25. In addition, the top plate 50 is rotated by the rotation motor 53. Simultaneously with the start of rotating the wafer W or after that, LED lamps 62 are turned on to heat the front surface of the wafer W. At this time, the wafer W is heated to about 200° C. After the temperature of the wafer W has been elevated to a predetermined temperature, an SPM is supplied from the SPM supply mechanism 57 to the chemical liquid supply pipe 56, and the SPM is discharged toward the center of the front surface of the wafer W from the lower opening 56a of the chemical liquid supply pipe 56. The SPM supply mechanism 57 is configured such that heated sulfuric acid of about 150° C. is supplied from the heated sulfuric acid supply source, that hydrogen peroxide solution of a normal temperature is supplied from the hydrogen peroxide solution supply source, and that, after the sulfuric acid and the hydrogen peroxide solution have been mixed with each other, the mixture thereof flows into the chemical liquid supply tube 56b. Heat is generated due to mixing of sulfuric acid and hydrogen peroxide solution. The mixed liquid (i.e., SPM) of about 180° C. to 200° C. is discharged toward the center of the front surface of the wafer W from the lower opening 56a. The SPM spreads from the central portion of the wafer W to the peripheral portion thereof by the centrifugal force, so that the front surface of the wafer W is covered with a SPM liquid film. Thus, an unnecessary resist film adhering to the front surface of the wafer W is lifted off (peeled off) and removed by the SPM. The removed resist film and a reaction product flow, together with the SPM, radially outward on the front surface of the wafer W by the centrifugal force. Then, the removed resist film and the reaction product flow outside the wafer W so as to be received by the treatment cup 40 and discharged from the discharge port 41.

While the SPM spreads out on the front surface of the wafer, the heat of the SPM is drawn by the wafer W, so that the temperature of the SPM lowers. In addition, since a circumferential velocity of the peripheral portion of the wafer is higher than a circumferential velocity of the central portion of the wafer, the peripheral portion of the wafer is cooled by an air flow near to the wafer, so that the temperature of SPM on the wafer peripheral portion tends to lower. Thus, there is a possibility that a reaction speed decelerates on the peripheral portion of the wafer so that the resist is insufficiently peeled off. However, in this embodiment, the peripheral portion of the wafer W is heated by the LED lamps 62. Therefore, the heat of the SPM drawn by the wafer W in its peripheral portion decreases, whereby the lowering of SPM temperature can be restrained in the whole area from the central portion to the peripheral portion of the front surface of the wafer W. Accordingly, a relatively uniform temperature distribution is achieved. As a result, the resist can be uniformly peeled off. Since the LED lamp 62 can heat only a part close to the front surface (irradiated surface) with respect to the thickness direction of the wafer W, only a required area (part close to the front surface) can be heated, without applying heat to the whole wafer W more than necessary. Furthermore, since the LED lamp 62 has a wavelength suitable for heating the wafer W, the LED lamp 62 does not heat members in the treatment chamber 12 other than the wafer W. Moreover, since the wafer W is heated by LED light of a wavelength suitable for heating the wafer W, the temperature of the wafer W can be increased in a short period of time.

In addition, since the top plate 50 is disposed above the wafer W and the inside space of the treatment cup 40 is sucked by the exhaust apparatus 44 through the discharge port 41, the downflow from the fan filter unit 14 is drawn into the treatment cup 40 through a gap between the treatment cup 40 and the top plate 50. Thus, fume generated in a space above the front surface of the wafer W during the SPM treatment can be prevented from leaking from the gap between the treatment cup 40 and the top plate 50. In addition, although condensates (liquid droplets) generate on the lower surface of the top plate 50, the condensates flow to the peripheral portion of the top plate 50 by the centrifugal force as the top plate 50 is rotating. Thus, it can be prevented that the liquid droplets as condensates of the fume fall onto the front surface of the wafer W to generate particles. The droplets having flown to the periphery of the top plate 50 scatter radially outward. Since the liquid droplets are led into the treatment cup 40 together with the downflow drawn into the treatment cup 40 through the gap between the treatment cup 40 and the top plate 50, scattering of the liquid droplets outside the treatment cup 40 can be prevented. In order to more completely prevent scattering of liquid droplets, a mechanism for elevating the top plate 50 (see a cylinder 58 shown in FIG. 2) or a mechanism for elevating the treatment cup 40 may be provided, such that the lower surface of the top plate 50 is located below the upper end of the treatment cup 40, during the SPM cleaning step.

<High Temperature DIW Rinsing Step>

After the SPM cleaning step has been performed for a predetermined period of time, the discharge of SPM from the chemical liquid supply pipe 56 is stopped and the heating of the wafer W by the LED lamps 62 is stopped. Then, the movable arm 52 is swung so that the top plate 50 and the LED lamp unit 60 are moved to the withdrawal position (position shown by the two-dot chain lines in FIG. 3). After that, the swing arm 73 is driven so that the high temperature DIW nozzle 70a is located right above the center of the wafer W. Deionized water of 60° C. to 80° C. (high temperature DIW) is discharged toward the center of the wafer, with the wafer W continuously rotating. The high temperature DIW flows radially outward on the front surface of the wafer W by the centrifugal force, flows outside the wafer W, then is received by the treatment cup 40, and is discharged through the discharge port 41. Thus, the SPM or the resist residue remaining on the front surface of the wafer W are rinsed away by the high temperature DIW that flows radially outward on the front surface of the wafer W. Owing to the rinsing operation with the high temperature DIW, the residue generated in the SPM cleaning step can be efficiently removed rapidly. In order to prevent the front surface of the wafer W from being dried after completion of the SPM cleaning step and before starting of the DIW rinsing step, a nozzle may be provided on an upper end opening periphery of the treatment cup 40. In this case, DIW is parabolically supplied to the center of the wafer W until the high temperature DIW nozzle 70a reaches the treatment position.

<Normal Temperature DIW Rinsing Sep>

After the high temperature DIW rinsing step has been performed for a predetermined period of time, the discharge of high temperature DIW from the high temperature DIW nozzle 70a is stopped. Then, the normal temperature DIW nozzle 70b is located right above the center of the wafer W. Normal temperature DIW (deionized water of normal temperature) is discharged toward the center of the wafer W, with the wafer W continuously rotating. The normal temperature DIW flows radially outward on the front surface of the wafer W by the centrifugal force, flows outside the wafer W, then is received by the treatment cup 40, and is discharged through the discharge port 41. Thus, the SPM and the resist residue remaining on the front surface of the wafer W are further removed by the flow of normal temperature DIW. In addition, the temperature of the wafer W is returned to normal temperature. Until the discharge of normal temperature DIW is started, the discharge of high temperature DIW is preferably continued.

<Spin Drying Step>

After the normal temperature DIW rinsing step has been performed for a predetermined period of time, the discharge of DIW from the normal temperature DIW nozzle 70b is stopped. Thereafter, the rotation speed of the wafer W is increased. Thus, the DIW on the front surface of the wafer W spins off by the centrifugal force, so that the wafer W is dried.

<Wafer Unloading Step>

After the spin drying step is completed, the lift pin plate 30 is elevated so that the lower surface of the wafer W is supported by the lift pin 32, and then the holding member 22 of the holding plate 20 releases the wafer W. The lift pin plate 30 is further elevated to be located at the elevated position. Then, the transfer arm 104 (see FIG. 1) enters the substrate cleaning apparatus 10, receives the wafer W from the lift pin plate 30, and exits from the substrate cleaning apparatus 10. In this manner, the series of treatment steps to one wafer W is completed.

According to the above embodiment, the following advantageous effects are achieved.

(1) Due to provision of the non-rotatable LED lamp unit 60 above the rotatable top plate 50, a wafer can be heated using a simple structure. Since the top plate 50 is formed of a material transmissive to light of the LED lamp, the provision of the LED lamp unit 60 and the top plate 50 as separated individual members is possible, allowing only the top plate 50 to rotate without rotating the LED lamp unit 60. Since the LED lamp unit 60 does not rotate, the power supply lines for feeding the LED lamps can be simplified. In addition, by rotating the top plate 50, condensates of fume adhering to the lower surface of the top plate 50 is prevented from falling onto the wafer W, as described above.

(2) Since scattering of fume can be prevented by the top plate 50, the LED lamps 62 are not exposed to the fume.

(3) By locally heating only a predetermined area of a wafer W with respect to the radial direction, in detail, only the peripheral area of the wafer W which is likely to cool with the use of the LED lamps 62 for a short period of time, the temperature distribution on the front surface of the wafer can be made uniform, whereby the reaction speed in the surface of the wafer can be made uniform. Moreover, the top plate 50 which is disposed above the wafer in order to prevent scattering of fume is formed of a material transmissive to the LED lamp light. Thus, when the treatment target surface (i.e., the surface having a pattern) of the wafer W is directed upward and treated, the treatment target surface of the wafer W can be directly heated by the LED lamp light. In more detail, the LED lamp light is wholly absorbed in a region from the surface of the wafer W to a depth of 100 μm, and is converted into heat. Since heating the portions of the resist in contact with the SPM, i.e., the surface of the resist and the vicinity thereof is effective, it can be said that the LED lamp light can locally heat only a required area in the thickness direction of the wafer W (about ⅛ of the wafer total thickness (about 775 μm in the case of 12-inch wafer) efficiently. Thus, it is possible to reduce the possibility that excessive heat input to the wafer W adversely affects properties of a device formed on the wafer W.

The above embodiment can be modified as described below, for example.

Figure 4:
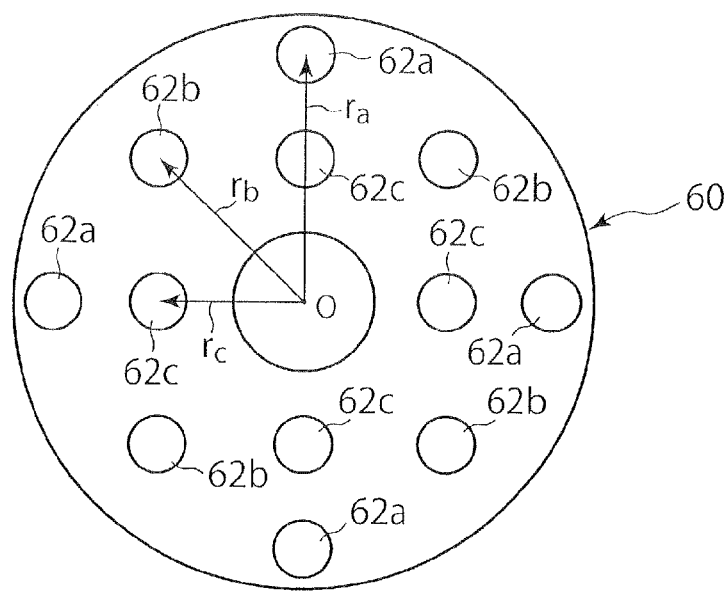
FIG. 4 is a plan view of only a LED lamp unit showing another arrangement of LED lamps.

The arrangement of the LED lamp 62 is not limited to that shown in FIG. 3. For example, as shown in FIG. 4, the LED lamps may be located at different radial positions. FIG. 4 shows an embodiment in which four first LED lamps 62a are arranged along a circle of a first radius "ra", four second LED lamps 62b are arranged along a circle of a second radius "rb", and four third LED lamps 62c are arranged along a circle of a third radius "rc", where the circles are centered at a point "O" (which corresponds to the center of the wafer W held by the holding plate 20 in plan view). In this case, the first LED lamps 62a, the second LED lamps 62b and the third LED lamps 62c are respectively connected to respective power source devices independently, so that the first LED lamps 62a, the second LED lamps 62b and the third LED lamps 62c can be independently controlled. In this manner, by arranging the LED lamps on different radial positions (ra, rb, rc), the temperatures of different radial areas on the wafer W can be independently controlled (a so-called zone control is possible).

Figure 5:
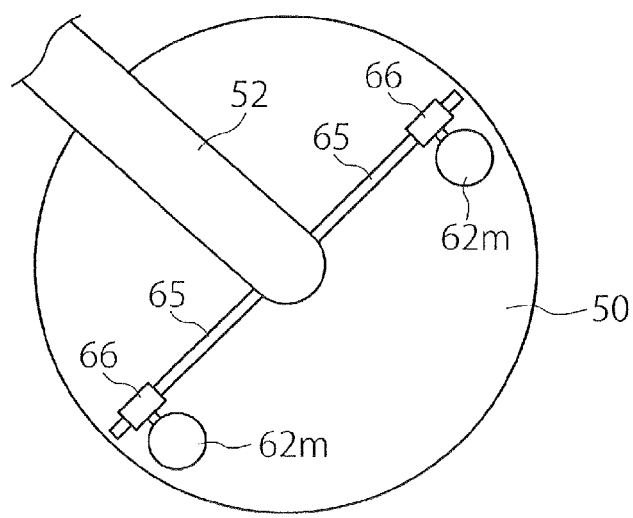
FIG. 5 is a plan view showing a modification provided with a LED lamp moving mechanism.

In addition, as shown in FIG. 5, the lamp support may be structured to include a LED lamp moving mechanism for moving the LED lamp 62. FIG. 5 shows an embodiment in which the plurality of (two) LED lamp moving mechanisms are provided. Each LED lamp moving mechanism includes a guide rail 65 fixed on a distal end portion of the movable arm 52 to extend radially outward, a moving member 66 provided therein with a driving mechanism to move along the guide rail 65, and an LED lamp 62m attached to the moving member 66. In this structure, the LED lamps 62m can be opposed to any radial area of the wafer W held by the holding plate 20. In addition, the LED lamps 62m can be moved (scanned) during the SPM treatment. Thus, the temperature distribution within the front surface of the wafer W can be controlled more precisely. The number of the guide rails 65 may be three or more. In addition, a plurality of moving members 66 and LED lamps 62m may be provided on the one guide rail 65.

The chemical liquid treatment performed by the substrate cleaning apparatus 10 is not limited to the aforementioned SPM treatment. The treatment may use a liquid that is heated to a temperature higher than a normal temperature (about 23 to 25° C. which is a temperature in a clean room). In addition, the chemical liquid may be a chemical liquid for plating process. In a given chemical treatment using a heated chemical liquid, by heating a wafer W by means of the LED lamp 62, the temperature distribution of the wafer W can be made uniform, whereby an in-plane uniformity of the treatment can be improved.

Although it is preferable that the top plate 50 is rotating during the chemical liquid treatment as described above, the top plate may be kept non-rotating in the case of performing a chemical liquid treatment under condition that condensates do not fall from the lower surface of the top plate 50, or in the case of performing a chemical liquid treatment where the falling down of condensates do not cause any problem. In the case that the top plate 50 is not rotating, the top plate 50 may be held by the lamp support 61, or the LED lamp 62 may be placed on the upper surface of the top plate 50. In addition, in the case that the top plate 50 is not rotating, the gap between the treatment cup 40 and the top plate 50 may be sealed when the top plate 50 is located at the treatment position.

Figure 6:
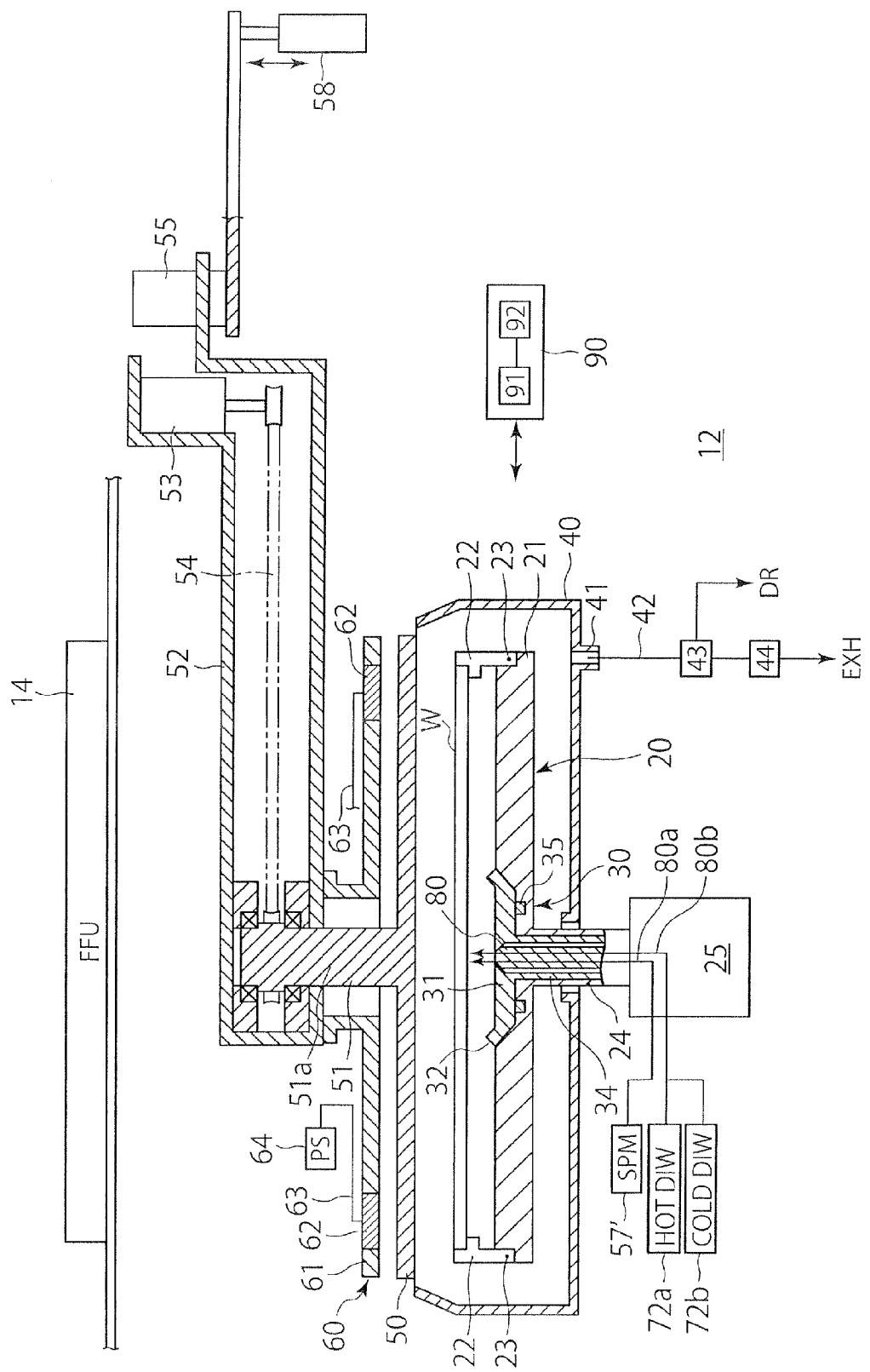
FIG. 6 is a vertical cross sectional view showing another embodiment of the substrate cleaning apparatus.

In the above embodiments, the wafer W is held by the holding plate 20 such that the "front surface" of the wafer W is the "upper surface" and that the "back surface" thereof is the "lower surface". In this state, the liquid treatment is performed by supplying a treatment liquid onto the upper surface of the wafer W. However, it is possible that the wafer W is held by the holding plate 20 such that the "front surface" of the wafer W is the "lower surface" and the "back surface" thereof is the "upper surface". In this case, the liquid treatment is performed by supplying a treatment liquid onto the lower surface of the wafer W. FIG. 6 shows an example of a structure of the substrate cleaning apparatus used in this case. The differences of the structure shown in FIG. 6 from that shown in FIG. 2 are described below.

In the structure of FIG. 6, the chemical liquid supply pipe 56 passing through the hollow rotation shaft 51 of the top plate 50 in the structure of FIG. 2 is removed. Furthermore, the rinse nozzles 70a and 70b and the swing arm 73 that supports the rinse nozzles 70a and 70b are removed. In place thereof, the elevation shaft 34 of the lift pin plate 30 is provided therein with a hollow, through which a treatment liquid supply pipe 80 serving as a chemical liquid nozzle passes. A SPM passage (chemical liquid passage) 80a and a DIW path (rinse liquid passage) 80b extend in the treatment liquid supply pipe 80. These passages open at an upper end of the treatment liquid supply pipe 80 toward a central part of the lower surface of the wafer W (see the arrows in FIG. 6). Thus, the treatment liquid supply pipe 80 serves as a chemical liquid nozzle and a rinse liquid nozzle that respectively supply a chemical liquid and DIW (rinse liquid) onto a treatment target surface of the wafer W. The SPM passage 80a is connected to a SPM supply mechanism 57', and the DIW passage 80b is connected to a high-temperature DIW supply mechanism 72a and a normal-temperature DIW supply mechanism 72b. The treatment liquid supply pipe 80 is configured to be capable of maintaining a stationary state (neither being rotated nor being elevated or lowered), even when the elevation shaft 34 of the lift pin plate 30 is rotated together with the rotation of the holding plate 20 upon the liquid treatment of the wafer W, or even when the elevation shaft 34 of the lift pin plate 30 is elevated or lowered for sending or receiving the wafer W. As the detailed structures of the holding plate 20, the lift pin plate 30 and the treatment liquid supply pipe 80, the structures disclosed in WO2009/101853A of the international patent application filed by the applicant of the present application can be employed.

A treatment using the substrate cleaning apparatus shown in FIG. 6 is briefly described. A wafer W is held by the holding plate 20 in the same way as the aforementioned wafer loading step and installing step. However, the wafer W is held by the holding plate 20 such that a front surface as a treatment target surface (a surface on which a device is formed, or a surface on which a resist film is formed) is a lower surface. It is preferable that the liquid treatment system shown in FIG. 1 is further provided with a reverser to reverse the wafer W to orient the front surface of the wafer W downward. Thereafter, the wafer W rotates, and the wafer W is heated by the LED lamp unit 60. Note that, at this time, since the front surface of the wafer W is the lower surface, the wafer W is heated by thermal conduction from the back surface. In this state, a SPM is discharged toward the central part of the lower surface of the wafer from the treatment liquid supply pipe 80, so that a resist is removed by the SPM. Also in this case, since a desired area in the surface of the wafer W is heated by the LED lamp unit 60, a uniform SPM treatment can be performed to the surface of the wafer W. After the SPM treatment completed, there is performed for a predetermined period of time a high temperature DIW treatment for discharging high temperature DIW toward the central part of the lower surface of the wafer from the treatment liquid supply pipe 80. Thereafter, there is performed for a predetermined period of time a normal temperature DIW treatment for discharging normal temperature DIW toward the central part of the lower surface of the wafer from the treatment liquid supply pipe 80. In the SPM treatment step, the high-temperature DIW rinsing step and the normal-temperature DIW rinsing step, the treatment liquids (SPM, DIW) having been supplied to the central part of the lower surface of the wafer flow radially outward along the lower surface of the wafer to scatter outward from the periphery of the wafer. Then, the treatment liquids are received by the treatment cup 40 and are discharged through the discharge port 41. After the normal-temperature DIW rinsing step has been performed for a predetermined period of time, the discharge of normal temperature DIW is stopped and the rotation speed of the wafer W is increased, so as to perform the spin drying step. After that, similarly to the aforementioned wafer unloading step, the wafer is unloaded from the substrate cleaning apparatus.

The substrate cleaning apparatus shown in FIG. 6 also achieves the same advantageous effects as those of the substrate cleaning apparatus shown in FIG. 2. Namely, due to the provision of the rotating LED lamp unit above the non-rotating top plate 50, a wafer can be heated by such a simple structure; since the LED lamp unit 60 is protected by the top plate 50 so as not to exposed to fume; and the LED lamp unit 60 can locally heat a predetermined radial area of the wafer W. In the substrate cleaning apparatus shown in FIG. 6, since the wafer W is heated from the back surface (upper surface) side, the front surface (the lower surface on which the pattern is formed) of the wafer W is heated by thermal conduction from the back surface side. Unlike the embodiment shown in FIG. 2, the heating efficiency of the front surface of the wafer W thus decreases to some degree. However, on the other hand, it can be prevented that the intensity distribution (microscopic-level variation) of the LED lamp light irradiated to the heated area is directly reflected in the temperature distribution of the front surface of the wafer W, whereby in-plane, non-uniformity of heating can be prevented.

Figure 7:
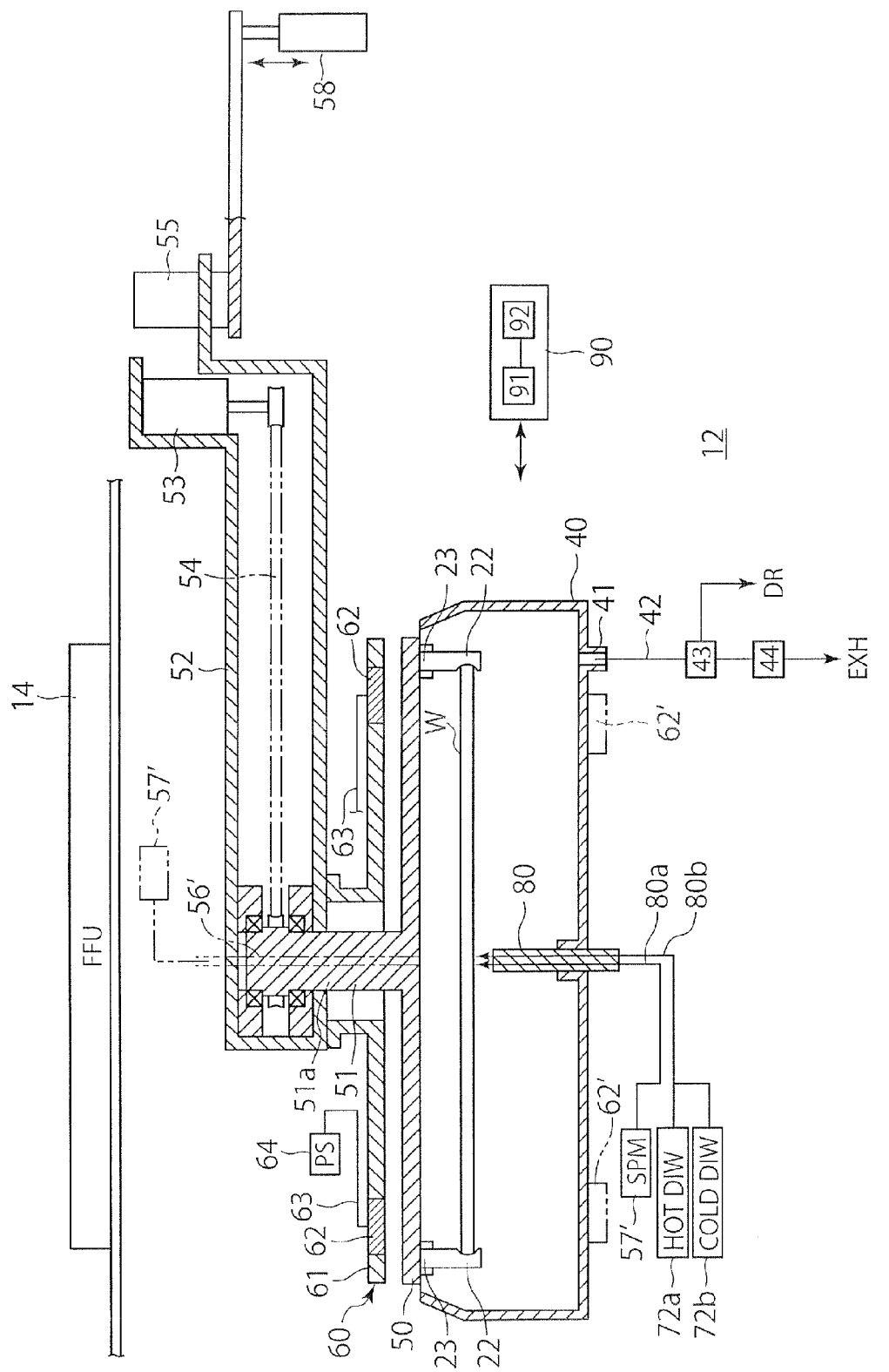
FIG. 7 is a vertical cross sectional view showing yet another embodiment of the substrate cleaning apparatus.

In addition, as shown in FIG. 7, the holding members 22 for holding a wafer W may be provided on the top plate 50. The differences of the structure shown in FIG. 7 from that shown in FIG. 6 are described below. In the substrate treatment apparatus shown in FIG. 7, the holding members 22 are mounted to the top plate 50 such that each holding member 22 can swing about the shaft 23. Since the holding members 22 are provided on the top plate 50, the holding plate 20 is omitted. Since the holding plate 20 is omitted, the treatment liquid supply pipe 80 is directly fixed to a bottom surface of the treatment cup 40.

A treatment using the substrate cleaning apparatus shown in FIG. 7 is briefly described. The top plate 50 is moved upward such that the wafer holding members 22 are located sufficiently above the upper end of the treatment cup 40. Then, the holding member 22 swing to locate at respective release positions (a state where the lower end of each holding member 22 is displaced outward). The transfer arm 104 (see FIG. 1) enters the substrate cleaning apparatus while holding the wafer W such that the front surface as the treatment target surface is directed downward. The wafer W is moved to a position which is right below the top plate 50 and is lower than the lower ends of the holding members 22. Thereafter, the wafer W is slightly moved upward by the transfer arm 104, and then the holding member 22 swing to locate at respective holding positions, so that the wafer W is held by the holding members 22. After that, the transfer arm 104 slightly moves downward, and then exits from the substrate cleaning apparatus. Following thereto, the top plate 50 is lowered to the position shown in FIG. 7.

Thereafter, the top plate 50 rotates, so that the wafer W held by the holding members 22 rotates together. Thereafter, similarly to the treatment by the substrate treatment apparatus of FIG. 6, the SPM treatment is performed by supplying a SPM liquid to the front surface (lower surface) of the wafer W from the treatment liquid supply pipe 80 while heating the wafer W by the LED lamp unit 60 from the back surface side (upper surface side). Thereafter, while a treatment fluid is supplied from the treatment liquid supply pipe 80 according to need, the high temperature DIW treatment, the normal temperature DIW treatment and the spin drying treatment are sequentially performed. The substrate treatment apparatus shown in FIG. 7 can achieve the same effects as those of the substrate treatment apparatus shown in FIG. 6. Further, since the holding plate 20, the driving mechanism thereof, the lift pin plate 30 and the driving mechanism thereof can be omitted, simplification of the structure and a lower cost of the apparatus are achieved.

In the substrate treatment apparatus shown in FIG. 7, a LED lamp 62' (shown by the one-dot chain lines) may be disposed on the bottom wall of the treatment cup 40 or below the bottom wall, so as to heat the wafer W from the lower surface side. In this case, the treatment cup 40 may be formed of a material, which is transmissive to LED light (LED light of a wavelength of 880 nm, for example) and has SPM corrosion resistance, for example, tetrafluoroethylene (PTFE). In the structure of FIG. 7, since the holding plate 20 is omitted, the wafer W can be efficiently heated by the LED lamp 62'.

In the substrate treatment apparatus shown in FIG. 7, the treatment liquid supply pipe (chemical liquid supply pipe) may be disposed inside the rotation shaft 51 of the top plate 50, in the same manner as that shown in FIG. 2. In FIG. 7, the treatment liquid supply pipe indicated by the reference sign 56' and the treatment liquid supply mechanism indicated by the reference sign 57' are schematically shown by the one-dot chain lines. In this case, unlike the structure shown in FIG. 2, a first supply pipe that supplies a SPM liquid and a high temperature DIW and a second supply pipe that supplies a normal temperature DIW are disposed in the rotation shaft 51. In this case, the wafer W is held by the substrate holding members 22 such that the front surface as the treatment target surface is directed upward.

EXPLANATION OF REFERENCE SIGNS

20 Holding plate
22 Substrate holding member
25 Rotation mechanism (rotation motor of rotation and elevation mechanism)
50 Top plate
52 Movable arm
53, 54 Rotation mechanism (rotation motor for top plate)
56 Chemical liquid supply pipe
80 Treatment liquid supply pipe
56b Chemical liquid supply tube
61; 65, 66 Lamp support
62 LED lamp

The invention claimed is:

1. A liquid treatment apparatus comprising:
a substrate holding member that holds a substrate horizontally;
a rotation mechanism that rotates the substrate holding member;
a chemical liquid nozzle that supplies a chemical liquid to the substrate held by the substrate holding member;
a top plate that covers the substrate held by the substrate holding member from above the substrate;
a rotation driving mechanism that rotates the top plate about a vertical axis;
a moving arm that moves the top plate;
at least one LED lamp that heats the substrate during a chemical liquid treatment by irradiating the substrate with light of a predetermined wavelength transmitted through the top plate from above the top plate; and
a lamp support supporting the LED lamp, wherein the LED lamp and the lamp support are non-rotatably fixed to the moving arm such that the LED lamp and the lamp support are separated from the top plate by a vertical gap therebetween, and wherein the LED lamp is movable so as to face different radial regions of the substrate held by the substrate holding member.

2. The liquid treatment apparatus according to claim 1, wherein a chemical liquid supply pipe is disposed outside the moving arm.

3. The liquid treatment apparatus according to claim 1, wherein a plurality of the LED lamps are provided, and the LED lamps are disposed so as to oppose different radial areas of the substrate held by the substrate holding member, and power supplied to the LED lamps can be controlled independently.

4. The liquid treatment apparatus according to claim 1, wherein the LED lamp irradiates light of a wavelength suitable for heating the substrate.

5. The liquid treatment apparatus according to claim 4, wherein the top plate is made of a material transmissive to the light of the wavelength irradiated by the LED lamp.

6. The liquid treatment apparatus according to claim 5, wherein the top plate is made of quartz or polytetrafluoroethylene.

7. The liquid treatment apparatus according to claim 1, wherein the chemical liquid is SPM (a mixture of sulfuric acid and hydrogen peroxide solution).

8. The liquid treatment apparatus according to claim 1, wherein the substrate holding member is provided on a holding plate, which is arranged such that the substrate is located between the top plate and the holding plate, and wherein the rotation mechanism is connected to the holding plate.

9. The liquid treatment apparatus according to claim 1, wherein the substrate holding member is provided on the top plate, and wherein the rotation mechanism is connected to the top plate.

10. The liquid treatment apparatus according to claim 1, further comprising a treatment cup that surrounds the substrate, wherein the top plate and the treatment cup forms a treatment space, and wherein the LED lamp is disposed outside the treatment space.

* * * * *